(12) United States Patent
Lee et al.

(10) Patent No.: US 6,537,898 B1
(45) Date of Patent: Mar. 25, 2003

(54) METHOD OF CRYSTALLIZING A SILICON FILM WITH A METAL CATALYST

(75) Inventors: Kyung-Eon Lee, Suwon-shi (KR); Sung-Ki Kim, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/466,175

(22) Filed: Dec. 17, 1999

(30) Foreign Application Priority Data

Dec. 19, 1998 (KR) .......................... 1998-56448

(51) Int. Cl.⁷ .......................... H01L 21/20; H01L 21/36
(52) U.S. Cl. ...................................................... 438/486
(58) Field of Search ................................ 438/166, 482, 438/485, 486

(56) References Cited

U.S. PATENT DOCUMENTS 5,569,936 A * 10/1996 Zhang et al. ................. 257/66
6,046,083 A * 4/2000 Lin et al. ..................... 438/255
6,162,667 A * 12/2000 Funai et al. ................. 438/166

\* cited by examiner

*Primary Examiner*—Michael Sherry
*Assistant Examiner*—Asok Kumar Sarkar
(74) *Attorney, Agent, or Firm*—Birch, Stewart, Kolasch & Birch, LLP

(57) ABSTRACT

A polysilicon film is formed by using a small quantity of metal and the contamination of the silicon film due to the metal is minimized. Moreover, the silicon crystallization is simplified since the polysilicon film is formed by MIC using a single layer of silicon containing the catalytic substance for the crystallization. The method of forming the polysilicon film includes the steps of forming a silicon layer containing a catalyst for silicon crystallization and crystallizing the silicon layer. The method further includes the steps of forming an amorphous silicon layer between the substrate and the silicon layer and crystallizing the silicon layer and the amorphous silicon layer.

19 Claims, 2 Drawing Sheets

METHOD OF CRYSTALLIZING A SILICON FILM WITH A METAL CATALYST

BACKGROUND OF THE INVENTION

1. Field of Invention

The present invention relates to a method of crystallizing a silicon film, more particularly, to a method of forming a polysilicon film by metal-induced crystallizing of a silicon film.

2. Discussion of the Related Art

Field effect mobility and stability of light irradiation of a polysilicon thin film transistor (hereinafter abbreviated TFT) are excellent when compared to those of an amorphous silicon TFT. Therefore, polysilicon TFTs are used as driving devices in active matrix liquid crystal displays (AMLCDs) as well as basic devices in peripheral circuits.

There are various methods of fabricating polysilicon and these methods are mainly divided into two classes: methods of depositing polysilicon directly and methods of depositing amorphous silicon and subsequently crystallizing it.

The methods of depositing polysilicon directly include chemical vapor deposition (CVD), photo-CVD, HR (hydrogen radical) CVD, ECR (electron cyclotron resonance) CVD, PE (plasma enhanced) CVD, LP (low pressure) CVD, and the like.

Methods of depositing amorphous silicon and subsequently crystallizing it include solid phase crystallization (hereinafter abbreviated SPC), liquid phase crystallization (LPC), crystallization by a pulse laser such as an excimer laser, and the like.

A recently introduced method for crystallizing amorphous silicon into the polycrystalline form lowers the temperature of crystallization to fabricate a TFT-LCD of large size. It is known as Metal Induced Crystallization (hereinafter abbreviated MIC). In MIC, the temperature of silicon crystallization is reduced to below 500° C. by contacting specific metals with amorphous silicon. The MIC effect is verified with various kinds of metals.

Crystallization by MIC is caused by various factors, depending on the kinds of metals present. Namely, the crystallization depends on the species of metals contacted with silicon.

Effects of metals such as Al, Au, Ag, and the like are ruled by diffusion of Si at the interface between the metal and the Si. The silicide formed at the interface is in a pseudo-stable state, hence the silicide lowers the crystallization energy, thereby accelerating the silicon crystallization.

Conversely, effects of other metals such as Ni, Ti, and the like are ruled by diffusion of the metal during annealing. Namely, the silicide state is formed at the interface between the metal and silicon by the diffusion of the metal into the silicon. The silicide thus lowers the temperature of crystallization. In MIC, using nickel as the metal, $NiSi_2$, the last phase of the Ni silicide, nucleates and accelerates the Si crystallization.

FIG. 1A and FIG. 1B show cross-sectional views of crystallizing a silicon film according to the related art method.

Referring to FIG. 1A, a silicon oxide buffer layer 10 is formed on an insulating substrate 100. An amorphous silicon film 11 is deposited on the buffer layer 10. Then, a metal film, used as a crystallization catalyst, such as an Ni film 13, is formed on the amorphous silicon film 11.

The Ni film 13 is deposited as a thin film on the amorphous silicon film 11 by a conventional method of sputtering.

Referring to FIG. 1B, the above insulating substrate 100 is heat-treated to crystallize the amorphous silicon film 11. As a result of the heat treatment, a silicide phase (not shown) is formed by Ni diffusion into the silicon layer. Then, the amorphous silicon film 11 is crystallized into a polysilicon film 19 at a lowered temperature since the silicide accelerates the crystallization of the silicon film.

The drawback of this related method is that the silicon crystallization is carried out by forming a Ni film 13 which has a predetermined thickness and that is used as a crystallization catalyst. Herein, nickel materials remains in the crystallized silicon film more or less, yielding TFTs of polysilicon film contaminated massively by the Ni, having poor device characteristics and that are improper for devices.

SUMMARY OF THE INVENTION

Accordingly, embodiments of the present invention provide a method of crystallizing a silicon film that substantially obviates one or more of the problems due to the limitations and disadvantages of the related art.

An object of the present invention is to provide a method of crystallizing a silicon film wherein an amorphous silicon film is crystallized by forming a silicon layer containing a catalytic substance for silicon crystallization as well as by using MIC.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as in the appended drawings.

To achieve these and other advantages and in accordance with the purpose of the present invention, as embodied and broadly described, the method for crystallizing a silicon film includes the steps of forming a silicon layer containing a catalyst for silicon crystallization, and crystallizing the silicon layer. The method further includes the steps of forming an amorphous silicon layer between the substrate and the silicon layer, and crystallizing the silicon layer and the amorphous silicon layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and, together with the description, serve to explain the principles of the invention.

DETAILED DESCRIPTION OF PREFERRED EMBODIMENTS

Reference will now be made in detail to the preferred embodiments of the present invention, examples of which are illustrated in the accompanying drawings.

Figure 1A:
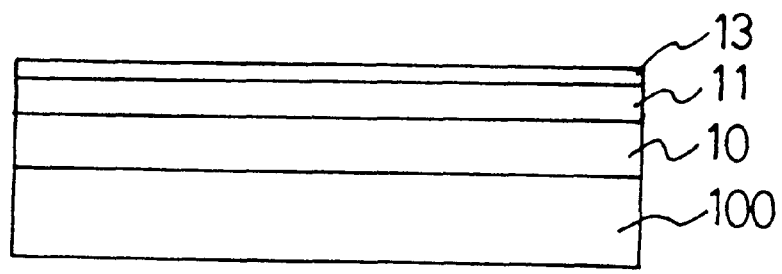
FIG. 1A and FIG. 1B show cross-sectional views of steps of the method of crystallizing a silicon film according to a related art method.
Figure 1B:
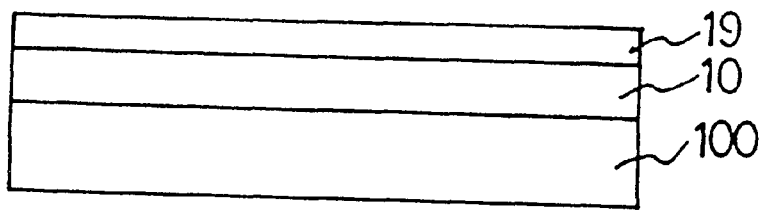
Figure 2A:
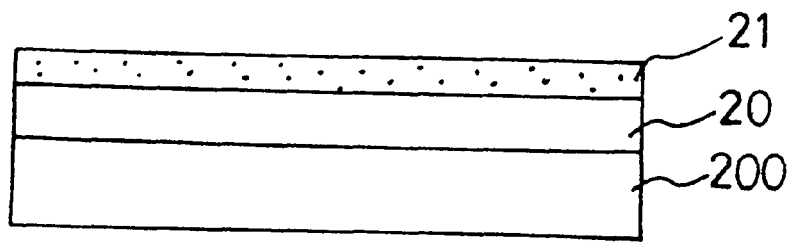
FIG. 2A and FIG. 2B show cross-sectional views of steps of the method of crystallizing a silicon film according to a first embodiment of the present invention.
Figure 2B:
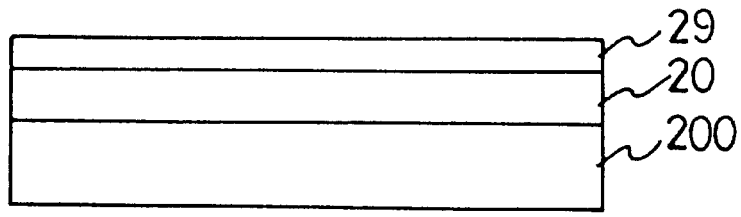

FIG. 2A and FIG. 2B show cross-sectional views of steps of the method of crystallizing a silicon film according to a first embodiment of the present invention.

Referring to FIG. 2A, a buffer layer 20 is formed on a substrate 200. A first silicon layer 21, containing a catalytic substance for silicon crystallization, is formed on the buffer layer 20 to the proper thickness. The buffer layer 20 prevents the substrate from getting damaged by the particles which may diffuse from the -metal composite silicon layer 21 during crystallization of the silicon film. The silicon-metal composite layer 21 for silicon crystallization is as effective in promoting crystallization as the amorphous silicon film 11 and the catalytic Ni film 13 of the related art.

The silicon-metal composite layer 21 may be formed by sputtering using a silicon target in which the catalytic substance for silicon crystallization is mixed with the silicon in a proper ratio. The silicon target containing the catalytic substance will hereafter be called a composite target.

It is possible to form a layer in which a predetermined substance is mixed in a proper ratio with silicon by sputtering the composite target onto a substrate. The ratio of the predetermined substance to the silicon is adjustable when the composite target is fabricated.

The silicon-metal composite layer 21 may be formed by sputtering a metal-silicon composite target in which the catalytic substance inducing silicon crystallization is contained in a concentration lower than 1000 ppm. The catalytic substance is one chosen from Ni, Cu, Fe, Co, Ru, Rh, Pd, Os, Ir, Pt, Sc, Ti, V, Cr, Mn, Zn, Au, Ag, and the like. When an Ni-Si composite target with an Ni:Si ratio under 1000 ppm is sputtered, a silicon film containing uniformly distributed Ni is formed.

Referring to FIG. 2B, a polysilicon film 29 is formed by crystallizing the -metal composite silicon layer 21. In this case, the crystallization is achieved by heat-treating the substrate 200 or by carrying out thermal treatment and applying voltage simultaneously.

During the crystallization, the catalytic substance for silicon crystallization is reacted with the nearby silicon to form a silicide (not shown). As the silicide works as a catalyst, silicon crystallization proceeds uniformly over the silicon-metal composite layer 21.

Hence, in a first embodiment of the present invention, the polysilicon film is formed by using a small quantity of metal and the contamination of the silicon film due to the metal is minimized. Moreover, the silicon crystallization is simplified since the polysilicon film is formed by MIC using a single layer of silicon containing the catalytic substance.

Figure 3A:
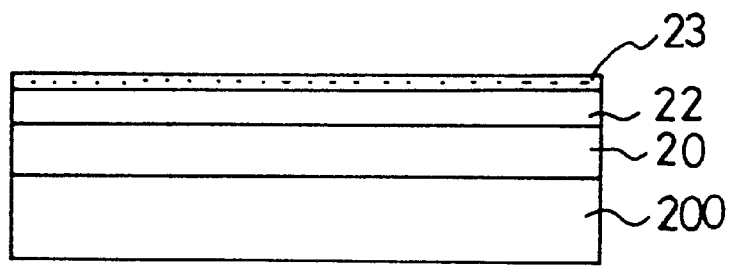
FIG. 3A and FIG. 3B show cross-sectional views of steps of the method of crystallizing a silicon film according to a second embodiment of the present invention.
Figure 3B:
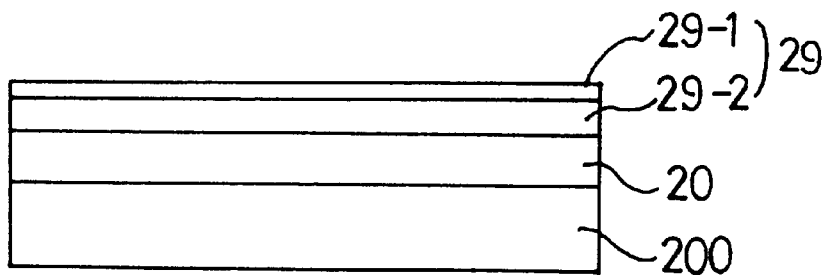

FIG. 3A and FIG. 3B show cross-sectional views of crystallizing a silicon film according to a second embodiment of the present invention.

Compared to the first embodiment of the present invention, the second embodiment differs by forming a subsidiary layer of amorphous silicon on a silicon crystallization inducing layer which includes a catalytic substance for crystallizing the silicon. For the convenience of explanation, the same numerals in the description of the first embodiment are used herebelow.

Referring to FIG. 3A, a buffer layer 20 is formed on a substrate 200. An amorphous silicon film 22, which will be crystallized, is formed on the buffer layer 20.

Then, a second silicon film 23, which includes a catalytic substance for crystallizing the silicon and acts as a silicon crystallization inducing layer, is formed on the amorphous silicon film 22.

The second silicon film 23 is formed by the same method of forming the silicon-metal composite layer 21 in the first embodiment of the present invention.

Referring to FIG. 3B, a polysilicon film 29 is formed by crystallizing the amorphous silicon film 22 and the second silicon film 23. In this case, the crystallization of the layers 22 and 23 is achieved by thermal treatment alone or by carrying out thermal treatment and applying voltage simultaneously.

In this case, the second silicon film 23 proceeds to be crystallized and forms a first polysilicon film 29-1. Subsequently, the first polysilicon film 29-1 induces the crystallization of the amorphous silicon film 22, thereby forming a second polysilicon film 29-2.

In the second embodiment of the present invention, the polysilicon film 29 is formed by using a small quantity of metal and the contamination of the polysilicon film 29 due to the metal is minimized.

In the embodiments of the present invention, the polysilicon film is formed by using a small quantity of metal and the contamination of the silicon film due to the metal is minimized.

Moreover, the silicon crystallization is simplified since the polysilicon film is formed by MIC using a single layer of silicon containing the catalytic substance for the crystallization.

It will be apparent to those skilled in the art that various modifications and variations can be made in the method of crystallizing a silicon film of the present invention without departing from the spirit or scope of the invention. Thus, it is intended that the present invention cover the modifications and variations of this invention provided they come within the scope of the appended claims and equivalents.

What is claimed is:

1. A method of crystallizing a silicon film comprising the steps of:

providing a substrate;

forming an amorphous silicon layer over the substrate;

forming a silicon-metal composite layer wherein said metal is a catalyst for silicon crystallization, the silicon-metal composite layer being formed using a different source than the amorphous silicon layer, the silicon-metal composite layer being formed by sputtering which uses a composite target consisting of silicon and a catalyst for silicon crystallization, the catalyst for silicon crystallization being contained in the composite target in a concentration less than or equal to 1000 ppm;

simultaneously crystallizing the silicon-metal composite layer and the amorphous silicon layer; and crystallizing the silicon film, wherein the catalyst is uniformly distributed in the silicon-metal composite layer.

2. The method of crystallizing a silicon film of claim 1, wherein the catalyst is a substance for inducing silicon crystallization selected from the group consisting of Cu, Ni, Fe, Co, Ru, Rh, Pd, Os, Ir, Pt, Sc, Ti, V, Cr, Mn, Zn, Au, and Ag.

3. The method of crystallizing a silicon film of claim 1, wherein the silicon-metal composite layer includes nickel.

4. The method of crystallizing a silicon film of claim 1, wherein the step of crystallizing the silicon-metal composite layer is achieved by heat-treating alone or by carrying out a thermal treatment and applying a voltage simultaneously.

5. The method of crystallizing a silicon film of claim 1, wherein the silicon-metal composite layer is formed by sputtering which uses a composite target consisting of silicon and a catalyst for silicon crystallization.

6. The method of crystallizing a silicon film of claim 1, wherein the silicon-metal composite layer includes nickel.

7. A method of crystallizing a silicon film comprising:
providing a substrate;
forming a buffer layer over the substrate;
forming an amorphous silicon film over the buffer layer;
forming a silicon-metal composite layer over the amorphous silicon film, the silicon-metal composite layer being formed using a different source than the amorphous silicon film, wherein said metal is a catalyst for silicon crystallization over the buffer layer, the silicon-metal composite layer being formed by sputtering which uses a composite target consisting of silicon and a catalyst for silicon crystallization, the catalyst for silicon crystallization being contained in the composite target in a concentration less than or equal to 1000 ppm; and
simultaneously crystallizing the amorphous silicon film and the silicon-metal composite layer to form a polysilicon film, wherein the catalyst is uniformly distributed in the silicon-metal composite layer.

8. The method of claim 7, wherein the step of forming a silicon-metal composite layer formed said silicon-metal composite layer so as to contain a concentration of less than 1000 ppm of the catalytic substance.

9. The method of claim 7, wherein the step of forming a silicon-metal composite layer forms said silicon-metal composite layer wherein the catalytic substance is one chosen from the group consisting of Ni, Cu, Fe, Co, Ru, Rh, Pd, Os, Ir, Pt, Sc, Ti, V, Cr, Mn, Zn, Au, Ag, and the like.

10. The method of claim 9, wherein the catalytic substance is Ni.

11. The method of claim 7, wherein the catalytic substance is uniformly distributed therein.

12. The method of claim 7, wherein the step of forming a silicon-metal composite layer step comprises sputtering with a composite target comprised of silicon and the catalytic substance.

13. The method of claim 7, wherein the buffer layer is of sufficient thickness to protect the substrate from particles that may penetrate into the substrate during crystallization.

14. The method of claim 7, wherein the step of crystallizing the silicon-metal composite layer comprises a crystallization that proceeds uniformly throughout the silicon-metal composite layer.

15. The method of claim 7, wherein the step of crystallizing further comprises:
crystallizing the silicon-metal composite film to form a first polysilicon film; and
crystallizing the amorphous silicon film to form a second polysilicon film.

16. The method of claim 15, wherein the crystallizing the amorphous silicon film step is induced by the first polysilicon film.

17. The method of claim 7, wherein the crystallizing the -metal composite silicon layer and amorphous silicon film step comprises a crystallization that proceeds uniformly throughout the second silicon layer and amorphous silicon film.

18. A method of crystallizing a silicon film comprising:
providing a substrate;
forming a buffer layer over the substrate;
forming an amorphous silicon film over the buffer layer;
forming a silicon-metal composite layer over the amorphous silicon film, the silicon-metal composite layer being formed using a different source than the amorphous silicon film, wherein said metal is a catalyst for silicon crystallization over the buffer layer, the silicon-metal composite layer being formed by sputtering which uses a composite target consisting of silicon and a catalyst for silicon crystallization, the catalyst for silicon crystallization being contained in the composite target in a concentration less than or equal to 1000 ppm; and
simultaneously crystallizing the amorphous silicon film and the silicon-metal composite layer to form a polysilicon film,
wherein the step crystallizing the silicon-metal composite layer comprises heat treating alone or comprises applying voltage simultaneously with thermal treatment.

19. A method of crystallizing a silicon film comprising the steps of:
providing a substrate;
forming an amorphous silicon layer over the substrate;
forming a silicon-metal composite layer wherein said metal is a catalyst for silicon crystallization, the silicon-metal composite layer being formed using a different source than the amorphous silicon layer, the silicon-metal composite layer being formed by sputtering which uses a composite target consisting of silicon and a catalyst for silicon crystallization, the catalyst for silicon crystallization being contained in the composite target in a concentration less than or equal to 1000 ppm;
simultaneously crystallizing the silicon-metal composite layer and the amorphous silicon layer; and crystallizing the silicon film,
wherein the step of crystallizing the silicon-metal composite layer is achieved by heat-treating alone or by carrying out a thermal treatment and applying a voltage simultaneously, and the catalyst is uniformly distributed in the silicon-metal composite layer.

* * * * *